United States Patent [19]

Hartup et al.

[11] Patent Number: 5,281,907
[45] Date of Patent: Jan. 25, 1994

[54] CHANNELIZED TIME-AND SPACE-INTEGRATING ACOUSTO-OPTICAL PROCESSOR

[75] Inventors: David C. Hartup, Marietta, Ga.; William T. Rhodes, Boulder, Colo.

[73] Assignee: Georgia Tech Research Corporation, Atlanta, Ga.

[21] Appl. No.: 947,903

[22] Filed: Sep. 18, 1992

Related U.S. Application Data

[63] Continuation of Ser. No. 683,640, Apr. 11, 1991, abandoned.

[51] Int. Cl.$^5$ .................. G02F 1/11; G01R 23/16; G01R 27/02
[52] U.S. Cl. .................. 324/76.37; 324/76.36; 364/822; 359/305; 359/306
[58] Field of Search .................. 342/197; 364/822; 359/305, 306, 308; 324/76.37, 76.36

[56] References Cited

U.S. PATENT DOCUMENTS

| | | | |
|---|---|---|---|
| 4,365,310 | 12/1982 | Green | 364/822 |
| 4,421,388 | 12/1983 | Berg | 359/306 |
| 4,426,134 | 1/1984 | Abramovitz | 359/306 |
| 4,468,093 | 8/1984 | Brown | 364/822 |
| 4,503,382 | 3/1985 | Zehl | 324/77 K |
| 4,531,196 | 7/1985 | Lin | 364/822 |
| 4,531,197 | 7/1985 | Lin | 364/822 |
| 4,566,760 | 1/1986 | Abramovitz | 364/822 |
| 4,607,344 | 8/1986 | Athale | 364/822 |
| 4,636,718 | 1/1987 | Labrum | 324/77 K |
| 4,641,273 | 2/1987 | Casasent | 364/822 |
| 4,644,267 | 2/1987 | Tsui | 324/77 K |
| 4,660,167 | 4/1987 | Casasent | 364/822 |
| 4,722,596 | 2/1988 | Labrum | 359/306 |
| 4,755,745 | 7/1988 | Cohen | 324/77 K |
| 4,758,976 | 7/1988 | Cohen | 364/822 |
| 4,801,872 | 1/1989 | Kitano | 324/77 K |
| 4,805,158 | 2/1989 | Fogarty | 364/822 |
| 4,833,637 | 5/1989 | Casasent | 359/306 |
| 5,121,248 | 6/1992 | Mohon | 359/306 |
| 5,153,597 | 10/1992 | Hueber | 359/306 |

Primary Examiner—Michael J. Tokar
Assistant Examiner—Jose M. Solis
Attorney, Agent, or Firm—James J. Cannon, Jr.

[57] ABSTRACT

A novel channelized, hybrid time- and space-integrating acousto-optic (AO) spectrum analyzer is described. The architecture consists of two acousto-optic cells in a crossed cell configuration. The first acousto-optic cell is a wide bandwidth device that performs space-integrating spectral analysis and channelizes signals according to carrier frequency. The second acousto-optic cell, in conjunction with a modulated source, performs time-integrating spectral analysis of the signal envelope using the chirp algorithm. One possible application of the processor is to determine the carrier frequency and pulse repetition frequency (PRF) of received radar signals.

2 Claims, 3 Drawing Sheets

CHANNELIZED TIME-AND SPACE-INTEGRATING ACOUSTO-OPTICAL PROCESSOR

This is a continuation of copending application Ser. No. 07/683,640 filed on Apr. 11, 1991 now abandoned.

BACKGROUND OF THE INVENTION

This invention pertains generally to signal processing, and specifically to the analysis of radar and communications signals. More particularly, it is directed to a channelized hybrid acousto-optic signal processor for real time analysis of signals having a high frequency carrier modulated by an envelope signal.

Fine frequency resolution spectral analysis of wide bandwidth signals is a challenging task found in many areas of signal processing. The task becomes even more challenging if the information must be processed in real-time. To perform this task, several acousto-optic architectures utilizing optical technology have been developed in the past. One-dimensional acousto-optic space-integrating architectures can analyze wide bandwidth signals, but the frequency resolution is limited. One-dimensional acousto-optic time-integrating architectures offer increased frequency resolution capability, but smaller bandwidths must be analyzed to obtain this resolution. The prior art discloses a number of combinations of space- and time-integrating processors developed to obtain large time-bandwidth product spectral analysis. The combinations include two-dimensional space-integrating, two-dimensional time-integrating, and two-dimensional hybrid space- and time-integrating processors.

In some applications, the signals of the interest consist of a high frequency carrier modulated by an envelope signal. It is convenient to classify these signals by both the carrier frequency and the spectral characteristics of the envelope signal. For the purpose of this application, the envelope signal will be defined specifically as the instantaneous power in the signal that modulates the high frequency carrier. The frequency resolution for analysis of the carrier frequency can be coarse, but finer resolution is required for the envelope spectrum. The present invention is directed to a novel optical processor that uses two acousto-optic cells in a crossed-cell configuration, developed to perform this type of analysis. Space-integration is used to channelize signals according to carrier frequency and time-integration is used to obtain the spectrum of each envelope signal used to modulate a particular carrier frequency.

SUMMARY OF THE INVENTION

A principal object of this invention is to provide an acousto-optic signal processor to analyze signals consisting of a high frequency carrier modulated by an envelope signal.

A further object of this invention is to provide such a processor in which space-integration is used to channelize signals according to carrier frequency and time-integration is used to obtain spectrum analysis of the envelope signal.

Another object of this invention is to provide such a processor in which the output consists of coarse grain spectral analysis of the signal along one spatial axis and analysis of the envelope of the signal along the orthogonal spatial axis.

Yet another object of the invention is to provide such a processor in which the carrier frequency and the pulse repetition frequency of a signal are analyzed in parallel.

Still a further object of this invention is to provide such an acoustic-optic processor which automatically separates multiple signals and automatically associates the correct envelope spectrum with its respective carrier frequency.

In a first aspect of the invention, an acousto-optic processor for real-time analysis of signals having a high frequency carrier modulated by an envelope signal channelizes said signals according to carrier frequency utilizing space-integration; and obtains the spectrum of the envelope signal of each of said carrier frequencies present in said signals utilizing time-integration. The processor thus automatically separates multiple signals and automatically associates each envelope spectrum with its respective carrier frequency.

In a second aspect of this invention, a two-dimensional, space-time integrating acousto-optic processor, used to perform spectral analysis of incoming signals and the envelopes of said signals, includes a first acousto-optic cell operating in a space-integrating mode, that serves as a spectrum analyzer to separate carrier frequencies of said incoming signals. The first acousto-optic cell has an electrical input port to receive said incoming signals and an optical input to receive illumination from a light source that is temporally modulated by a biased sinusoid of linearly increasing frequency (a chirp-that is, the source is chirped in intensity). The output of the first acousto-optic cell is diffracted light. A second acousto-optic cell having a two dimensional active area operates in a time-integrating mode. This cell has an optical input consisting of diffracted light outputted from said first acousto-optic cell and an electrical input consisting of a constant frequency sinusoid added to a frequency shifted version of the chirp that is used to modulate the intensity of the illumination source. The output light intensity of the second acousto-optic cell is time-integrated to produce spectral analysis of the envelope modulation of each carrier frequency within said signals in the electrical input of said first acousto-optic cell. The output of the processor is a spectral analysis of said incoming signals and their carrier frequency envelopes, in which said processor automatically separates multiple signals and automatically associates each envelope spectrum with its respective carrier frequency.

In a third aspect of the invention, a two-dimensional, space-time integrating acousto-optic processor to perform spectral analysis of the carriers of incoming signals and of the envelopes of said signals, has a first acousto-optic cell operating in a space-integrating mode, serving as a spectrum analyzer to separate incoming signal information on the basis of carrier frequencies of said incoming signals. An optical light source temporally modulated in intensity by a biased sinusoid of linearly increasing frequency, utilizing a first chirp signal, produces illumination from said modulated light source as the optical input to said first acousto-optic cell. The incoming signals serve as the electrical input to the first acousto-optic cell. This cell produces, as output, diffracted light in which the angles of diffraction are indicative of the carrier frequencies present in said incoming signals. A second acousto-optic cell receives said diffracted light outputted from said first acousto-optic cell as its optical input, and receives a second chirp signal and sinusoid as its electrical input. Said diffracted light from the first acousto-optic cell is temporally modulated in intensity by said chirped illumination source and by the envelope signal associated with each carrier frequency. Said first and second chirp signals act together to perform time-integrating spectral analysis of the envelope modulating each carrier frequency in said incoming signals. Said time-integrated output intensity of said second acousto-optic cell is a bias term plus the envelope spectrum on a spatial carrier. The output of said processor is a two-dimensional carrier frequency/envelope frequency plane ready for further processing.

DESCRIPTION OF PREFERRED EMBODIMENT

The present invention pertains to a channelized hybrid acousto-optic processor which provides a means of analyzing signals that consist of a high frequency carrier modulated by an envelope signal. Although not required for proper functioning of this processor, the envelope signal typically consists of a periodically pulsed signal. Some applications of signal processing require determination of the carrier frequency and the frequency of the pulses of a pulsed, high frequency signal. If the phase of the high frequency carrier is coherent from pulse-to-pulse, the frequency of the carrier and the frequency of the pulses may be determined from fine frequency spectral analysis of the modulated signal. However, if the high frequency carrier is not phase coherent from pulse-to-pulse, the frequency of the carrier may still be determined from spectral analysis of the signal, but the frequency of the pulses must be determined by separately analyzing the envelope of the signal. The processor of the invention disclosed herein separates signals by carrier frequency and analyzes the spectral content of the envelope of each carrier signal to determine the repetition frequency of the pulses.

Figure 1:
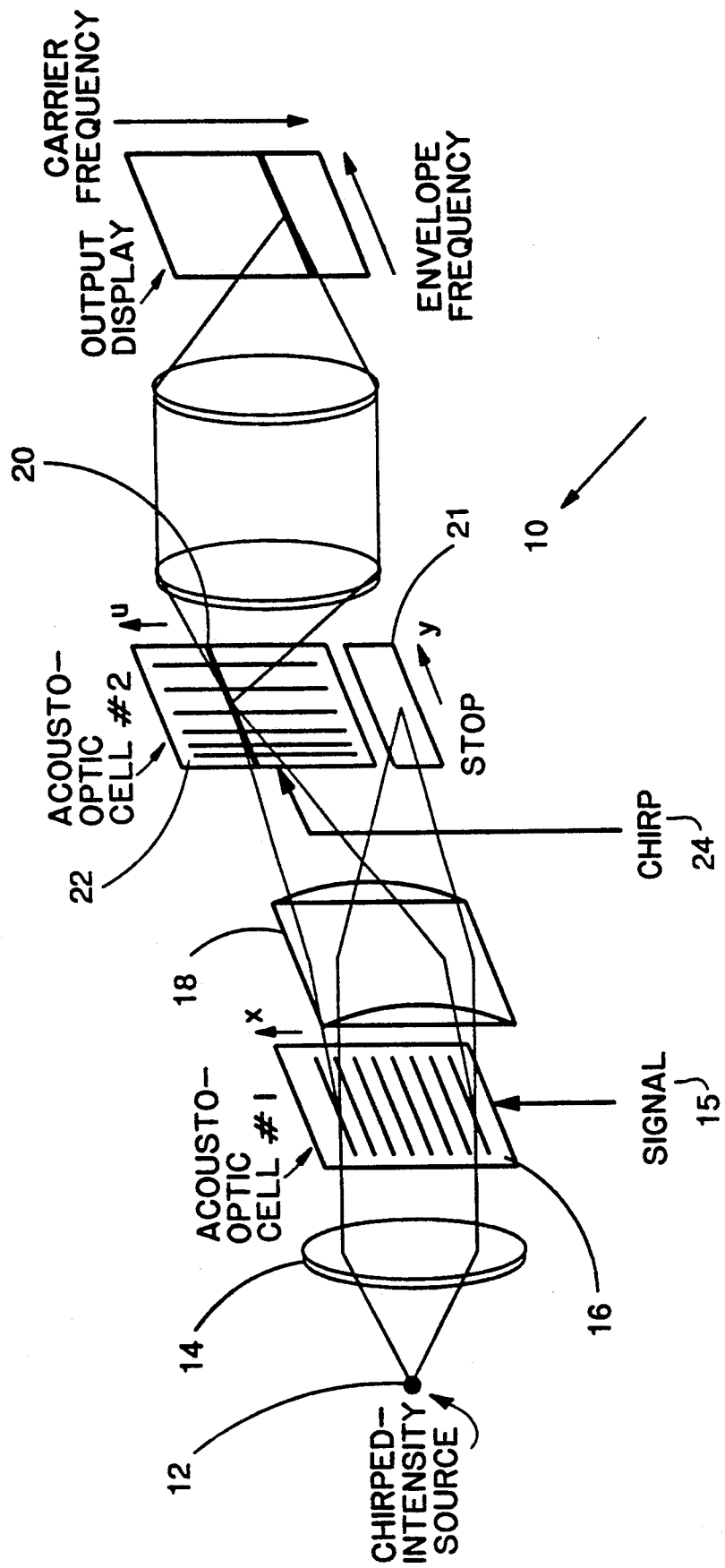
FIG. 1 is a diagrammatic representation of one embodiment of a channelized hybrid acousto-optic processor, according to the invention.

Referring now to the drawings, a diagrammatic illustration of the preferred embodiment of the processor 10 of this invention is shown in FIG. 1. Processor 10 uses acousto-optic devices to provide information about the frequency of the carrier and the spectrum of the envelope signal and provides a means of analyzing signals that consist of a high frequency carrier modulated by an envelope signal. An optical (light) source 12, which is temporally modulated in intensity by a biased chirp signal, is collimated by a lens 14, thereby producing collimated illumination on a first acoustic-optic (AO) cell 16. The signal 15 to be analyzed, which may consist of many signals at different carrier frequencies, provides the electrical input for acousto-optic cell 16, which is a wide bandwidth cell that is operated in the Bragg regime. The raw input signal 15 may be shifted up or down in frequency to put it in the correct band for input to acousto-optic cell 16. Both undiffracted and diffracted light from acousto-optic cell 16 are focused by the cylindrical lens 18. The undiffracted light is blocked by an on-axis stop 21 at the back focal plane of the cylindrical lens 18. The diffracted light forms a horizontal stripe 20 for each carrier frequency present in the input signal 15. The vertical separation of the stripes 20 channelizes carriers according to frequency. The intensity distribution in the vertical direction corresponds to the power spectrum of the input signal 15. The acousto-optic cell 16, lens 14, lens 18, and the light source 12 are used to perform a spatial integration Fourier transform on the input signal 15. The technique for doing this operation is well known and well documented in the technical literature. Cf., for example, T. Turpin, "Spectrum Analysis Using Optical Processing," Proc. IEEE, vol. 69, pp. 79–92, January 1981.

Even for signals in which details of the envelope spectrum can be obtained by fine grain spectral analysis of the signal, these details will in general not be resolvable from the output of acousto-optic cell 16, because the frequency resolution along the vertical direction is inversely proportional to the aperture time of acousto-optic cell 16. Because of this and also because details of the envelope spectrum for some signals must be obtained by separately analyzing the envelope signal, time-integrating spectral analysis is performed by a second acousto-optic cell 22 on the envelope signal.

In the rear focal plane of lens 18 is a second acousto-optic cell 22. If signals with different carrier frequencies are present in the input signal 15, their spectra will occupy different vertical positions at the input to second acousto-optic cell 22. Each signal will form a horizontal line 20 of light at the input to second acousto-optic cell 22, its vertical position being uniquely determined by the carrier frequency of the signal. The horizontal stripes of light 20 serve as the optical input for second acousto-optic cell 22. Each stripe 20 is temporally modulated in intensity by both the chirped illumination source 12 and by the envelope signal that modulates the carrier corresponding to a particular stripe 20. A constant frequency sinusoid added to a frequency shifted version of the chirp that is used to modulate the source 12 is used as the electrical input for second acousto-optic cell 22. Second acoustic-optic cell 22 is operated in the Bragg regime, and only the diffracted components are imaged to the output plane. The resulting time-space modulation of the light intensity transmittance of second acousto-optic cell 22, in conjunction with the chirped intensity modulation of the source, produces by time-integration of the output intensity, optical spectrum analysis of the envelope of the input signal 15. This process of time-integrating spectral analysis is also well known in the art (Turpin, ibid.).

Figure 2:
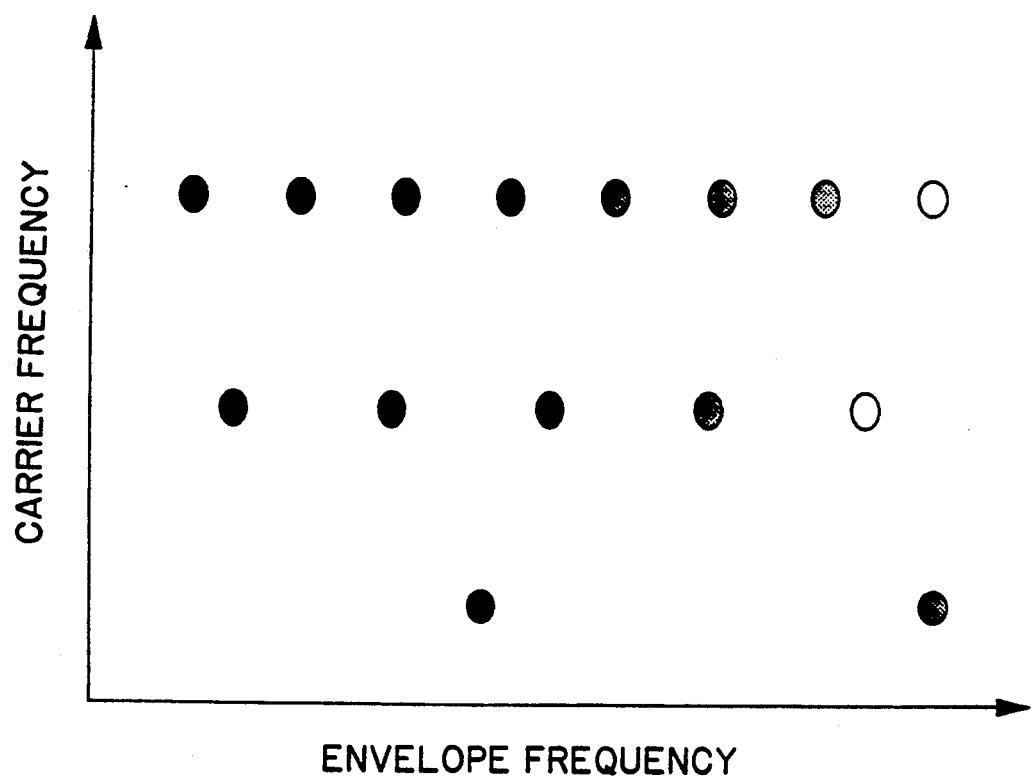
FIG. 2 is a plot of the time-integrated output intensity of the processor of FIG. 1, for one particular carrier frequency.

The nature of the time-integrated intensity pattern of the output along a particular horizontal stripe 20 is illustrated in FIG. 2. It consists of a bias term plus the envelope spectrum on a spatial carrier.

Figure 3:
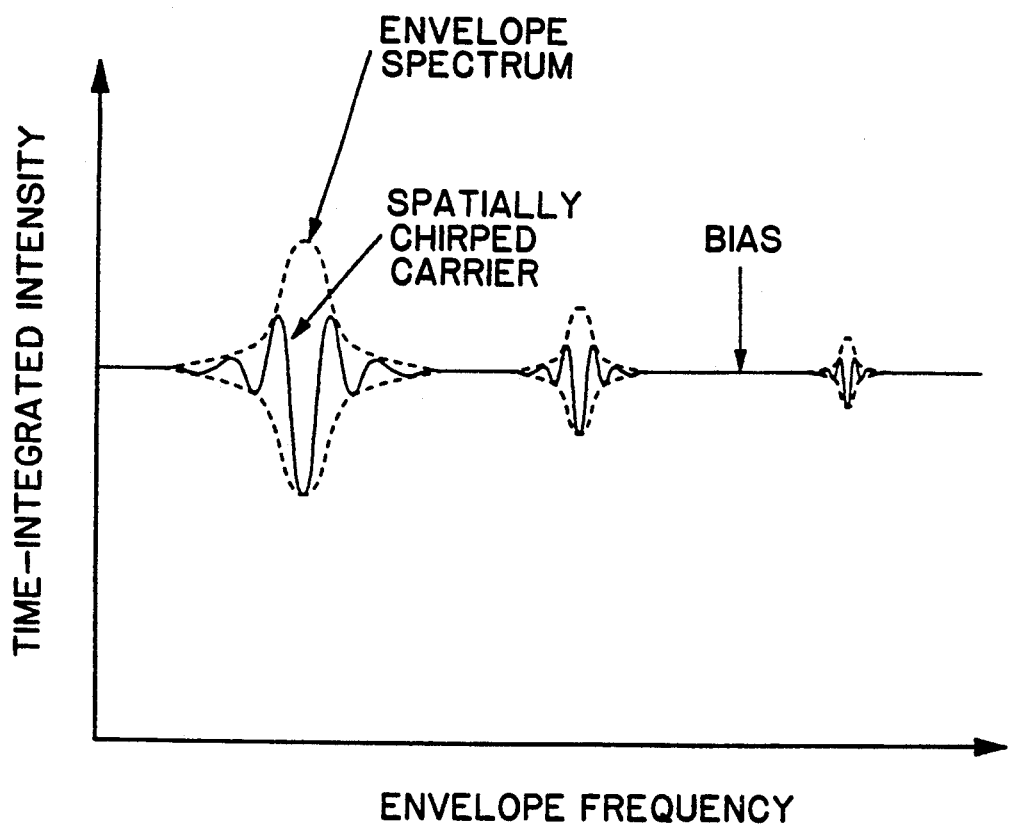
FIG. 3 is a plot of an illustrative display of the entire output of the processor of FIG. 1, ignoring the bias and spatial carrier illustrated in FIG. 2.

FIG. 3 illustrates the output display of the entire two-dimensional carrier frequency/envelope frequency plane. The bias and spatial carrier are ignored, and the envelope of the variations about the constant bias, which are due to the envelope spectrum, are represented by the dots. For the output shown in FIG. 3, the input consists of three different carrier frequencies and three different pulse repetition frequencies.

A mathematical input-output relationship that emphasizes the functional nature of the processor will now be summarized. The output intensity will be found by forming the product of the source intensity and the intensity transmittance functions of first acousto-optic cell 16 and second acousto-optic cell 22.

The source intensity 12 is temporally modulated by a chirp signal and can be modeled as $$I_s(t) = A_s \left\{ 1 + m_s \cos\left[ 2\pi \left(f_o + \frac{\alpha T}{2}\right)t + \alpha\pi t^2 \right] \right\} \quad (1)$$

where $A_s$ is an intensity scaling factor, $m_s$ is the source modulation depth, $f_o$ is the chirp offset frequency, $\alpha$ is the chirp rate, and $T$ is the chirp duration.

The signal 15 to be analyzed, $s(t)$, is input to first acousto-optic cell 16. If the effective intensity transmittance of first acousto-optic cell 16 is defined to include the propagation to the back focal plane of the cylindrical lens 18 and the blocking of all but the positive diffracted orders, it can be modeled as $$T_1(u,t) = \eta_1 e(u,t) |S_c(u)|^2 \quad (2)$$

where $u$ is the spatial frequency variable along the x direction (direction of acoustic wave propagation in first acousto-optic cell 16), $\eta_1$ is the optical intensity diffraction efficiency of acousto-optic cell 16 in units of %/W, $e(u,t)$ is a real valued function that describes the envelope of a carrier signal (with frequency corresponding to u) as the envelope propagates across first acousto-optic cell 16, and $S_c(u)$ is equal to the spectrum of the carrier signal for positive frequencies.

A constant frequency sinusoid added to a frequency shifted version of the chirp signal that is used to modulate the source 12 is used as the electrical input 24 to second acousto-optic cell 22. This signal can be modeled as $$\cos[2\pi f_c] + \cos\left[ 2\pi \left(f_c + f_o + \frac{\alpha T}{2}\right)t + \alpha\pi t^2 \right]. \quad (3)$$

Noting that all but the positive diffraction components from second acousto-optic cell 22 are blocked, the intensity transmittance for second acousto-optic cell 22 can be modeled as $$T_2(u,y,t) = \eta_2 + \quad (4)$$

$$\eta_2 \cos\left[ 2\pi \left(f_o + \frac{\alpha T}{2}\right)\left(t - \frac{y}{V_2}\right) + \alpha\pi\left(t - \frac{y}{V_2}\right)^2 \right].$$

where $y$ is the direction of acoustic velocity in second acousto-optic cell 22, $\eta_2$ corresponds to the diffraction efficiency, and $V_2$ is the acoustic velocity in second acousto-optic cell 22.

Letting $y/V_2 = \tau$, the time-integrated processor output can now be written as $$= A_s \eta_1 \eta_2 |S_c(u)|^2 \int_{-\frac{T}{2}}^{\frac{T}{2}} e(u,t) \{ 1 + \quad (5)$$

$$\cos\left[ 2\pi \left(f_o + \frac{\alpha T}{2} - \alpha\tau\right)t + \alpha\pi t^2 - \phi(\tau) \right] +$$

$$m_s \cos\left[ 2\pi \left(f_o + \frac{\alpha T}{2}\right)t + \alpha\pi t^2 \right] +$$

$$\frac{m_s}{2} \cos[2\pi(2f_o + \alpha T - \alpha\tau)t + 2\pi\alpha t^2 - \phi(\tau)] +$$

$$\frac{m_s}{2} \cos[2\pi\alpha\tau t + \phi(\tau)] \Big\} dt$$

where $$\phi(\tau) = 2\pi \left(f_o + \frac{\alpha T}{2}\right)\tau - \alpha\pi\tau^2. \quad (6)$$

Each term of Eq. (5) is now discussed separately. Evaluating the integral for the first term in the outer brackets, 1, results in a signal-dependent bias (as shown in FIG. 2). The second, third, and fourth terms are all chirp signals. The minimum instantaneous frequency of any of these terms is $(f_o - \alpha\tau)$. The quantity $\alpha\tau$ is the envelope spectrum analysis frequency and is assumed to be much smaller than $f_o$. It is also assumed that $$\frac{1}{f_o} << T. \quad (7)$$

Therefore, the time integral of the second, third, and fourth terms is approximately zero. The time integral of the fifth term results in the desired envelope spectrum. It can be rewritten as $$= \frac{A_s \eta_1 \eta_2 m_s}{2} |S_c(u)|^2 |E(u,\alpha\tau)| \cos[\theta(\alpha\tau) + \phi(\tau)] \quad (8)$$

where $$E(u,f) = FT\left[ e(u,t) \text{rect}\left(\frac{t}{T}\right) \right] \quad (9)$$

$$= |E(u,f)| \exp[-j\theta(f)].$$

The nature of the fifth term is evident from Eq. (8). The term $|S_c(u)|^2$ is the power spectrum of the signal spread spatially along the u-axis. The frequency resolution is not fine enough to determine details of the envelope spectrum. Along the orthogonally oriented y-axis and multiplying this term is $|E(u,\alpha\tau)| \cos[\theta(\alpha\tau) + \phi(\tau)]$, which is the magnitude of the envelope spectrum multiplied by a spatially chirped carrier [refer back to Eq. 6) for $\phi(\tau)$]. The chirp frequency variation will be small because it is assumed that $\alpha\tau$ is much smaller than $f_o$ and that $\theta(\alpha\tau)$ varies slowly in comparison to $\phi(\tau)$. Another interesting characteristic of this processor is evident from Eq. (8). The output intensity along the carrier frequency axis is proportional to the power in the carrier signal, and the output intensity variation along the envelope frequency axis is proportional to the power in signal that modulates the high frequency carrier.

The architecture permits a wide range of carrier frequencies to be analyzed while providing fine frequency resolution for the envelope spectrum. Because the carrier frequencies are channelized using the space-integrating section of the processor, the carrier frequency resolution is inversely proportional to the aperture time of first acousto-optic cell 16. Using currently available devices, a bandwidth of 1 GHz can be analyzed with 1 MHz resolution.

The envelope frequency spectrum is obtained using the time-integrating section of the processor. This allows the frequency range and resolution of the envelope spectrum to be adjusted by changing the parameters of the chirp signal. The parameters can be changed using electronic control; no change in processor architecture is required. Using current technology, the envelope frequency analysis range can be divided into more than 1000 frequency cells.

The processor 10 shown in FIG. 1 automatically separates multiple signals and associates the correct envelope spectrum with the corresponding carrier frequency. In the area of radar signal processing, this task is very complicated for electronic processors to perform and becomes even more complicated if radar signals with staggered or random pulse spacings are present. Processing time is increased by the deinterleaving algorithms typically used by electronic processors to separate multiple signals.

One disadvantage of some previously designed optical processors is the presence of a signal independent bias term in the output. From the analysis of each term of Eq. (5), it can be seen that the bias for this processor only contains a signal dependent term. Depending on specific implementation issues, this could provide the capability to increase the source power to detect weak signals without saturating the entire detector plane.

Various modifications and additions will be apparent to those skilled in the art of acousto-optic signal processing. In particular, the precise configuration and sequence of lenses in relation to the acousto-optic cells may be varied without departing from the principles of this invention. Also, the signal input to the second acousto-optic cell may be changed to just a chirp signal, in which case the desired output consists of the time-integrated intensity of both the diffracted and undiffracted light from said second acousto-optic cell. Hence, the scope of the invention is to be limited only by the following claims.

What is claimed is:

1. A two-dimensional, space-time integrating acousto-optic processor to perform spectral analysis of the carriers of incoming signals and the envelopes of said signals, comprising:

a first acousto-optic cell operating in a space-integrating mode, serving as a spectrum analyzer to separate incoming signal information on the basis of carrier frequencies of said incoming signals;

an optical light source temporally modulated in intensity by a biased sinusoid of linearly increasing frequency (a first chirp signal);

means to produce illumination from said modulated light source as the optical input to said first acousto-optic cell;

said incoming signals serving as the electrical input to first acousto-optic cell;

said first acousto-optic cell producing as output diffracted light indicative of the carrier frequencies present in said incoming signals;

a second acousto-optic cell receiving said diffracted light outputted from said first acousto-optic cell as its optical input;

said second acousto-optic cell receiving a second chirp signal and sinusoid as its electrical input;

said diffracted light forming a uniquely positioned horizontal stripe on said second acousto-optic cell for each carrier frequency present in said incoming signals;

each of said horizontal stripes being temporally modulated in intensity by said chirped source and by the envelope signal associated with its carrier frequency;

said first and second chirp signals acting together to perform time-integrating spectral analysis of the signal envelope of each carrier frequency in said incoming signals;

said time-integrated output of said second acousto-optic cell being a bias term plus the envelope spectrum on a spatial carrier;

means to present the time-integrated output intensity of said processor as a two-dimensional carrier frequency/envelope frequency plane for further processing; and means to adjust the bandwidth and frequency resolution of the envelope spectral analysis through control of the signal modulating the illumination source and through control of the signal used as input to the second acousto-optic cell.

2. A two-dimensional, space-time integrating acousto-optic processor to perform spectral analysis of incoming signals and the envelopes of said signals, comprising:

a first acousto-optic cell operating in a space-integrating mode, serving as a spectrum analyzer to separate carrier frequencies of said incoming signals;

said first acousto-optic cell having:
electrical input means to receive said incoming signals;
optical input means to receive illumination from a light source temporally modulated by a first chirp signal;

said first acousto-optic cell having as its output diffracted light;

a second acousto-optic cell having a two dimensional active area, operating in a time-integrating mode;

said second acousto-optic cell having:
an optical input consisting of focused diffracted light outputted from said first acousto-optic cell;
an electrical input consisting of a second chirp signal;

said second acousto-optic cell having a time-integrated output intensity containing a spectral analysis of the envelope modulation of each carrier frequency within said incoming signals in the electrical input of said first acousto-optic cell;

whereby the output of said processor is a spectral analysis of said incoming signals and their carrier frequency envelopes, in which output said processor automatically separates multiple signals and automatically associates each envelope spectrum with its respective carrier frequency.

* * * * *